United States Patent [19]

Sato

[11] Patent Number: 5,471,944
[45] Date of Patent: Dec. 5, 1995

[54] METHOD FOR FORMING CRYSTAL ARTICLE

[75] Inventor: Nobuhiko Sato, Atsugi, Japan

[73] Assignee: Canon Kabushiki Kaisha, Tokyo, Japan

[21] Appl. No.: 324,487

[22] Filed: Oct. 18, 1994

Related U.S. Application Data

[63] Continuation of Ser. No. 791,509, Nov. 14, 1991, abandoned.

[30] Foreign Application Priority Data

Nov. 16, 1990 [JP] Japan .................................. 2-308605

[51] Int. Cl.$^6$ .................................................. C30B 25/04
[52] U.S. Cl. .................................. 117/84; 117/90; 437/89
[58] Field of Search ................................ 117/84, 88, 90; 437/89, 150

[56] References Cited

U.S. PATENT DOCUMENTS 4,383,883  5/1983  Mitzutani ............................. 156/603
4,450,041  5/1984  Aklufi ................................... 156/603
4,929,566  5/1990  Beitman ................................ 437/89

Primary Examiner—R. Bruce Breneman
Assistant Examiner—Felisa Garrett
Attorney, Agent, or Firm—Fitzpatrick, Cella, Harper & Scinto

[57] ABSTRACT

A method for forming a crystal article comprises forming a plurality of monocrystals with a desired size at a desired position on a substrate comprising an amorphous insulating material and having a non-nucleation surface by crystal forming treatment, wherein prior to the crystal forming treatment a plurality of concavities with a desired size and form are formed respectively in a region to be covered with a single monocrystal on the substrate, and a single monocrystal is formed to full the plurality of concavities by the crystal forming treatment and thereafter the monocrystal is flattened by removing it to the same level as the upper surface of the substrate.

7 Claims, 4 Drawing Sheets

METHOD FOR FORMING CRYSTAL ARTICLE

This application is a continuation of application Ser. No. 07/791,509 filed Nov. 14, 1991, now abandoned.

BACKGROUND OF THE INVENTION

1. Field of the Invention

The present invention relates to a method for forming a crystal article, and particularly relates to a method for forming a crystal article comprising forming a plurality of monocrystals with controlling their positions and sizes on an amorphous insulating substrate, and then flattening the monocrystals.

The present invention is applicable to a method for forming crystal articles which are used in semiconductor integral circuits, magnetic circuits and so on.

2. Related Background Art

In the field of SOI (Silicon On Insulator) technology that a plurality of monocrystals are grown on an insulating substrate, for example, as in the first method, a method is proposed for forming crystals based on selective nucleation due to the difference of nucleation density between the surface materials (T. Yonehara et al. (1987) Extended Abstracts of the 19th SSDM. 191).

This method for forming crystals is described with reference to FIGS. 2A to 2C.

As shown FIG. 2A, first, regions 207 and 207' which have the surfaces with a larger nucleation density than that of a surface 203 are arranged on a substrate 201 having the surface 203 with a small nucleation density, a diameter of a and an interval of b. When this substrate is crystal-forming treated, nuclei 209 and 209' of deposite are deposited only on the surfaces of the regions 207 and 207', and nuclei are not deposited on the surface 203 (FIG. 2B). Therefore, the surface of regions 207 and 207' are called nucleation surfaces, and the surface 203 is called nonnucleation surface. When the nuclei 209 and 209' generated on the nucleation surfaces 207 and 207' are further grown, crystal grains 210 and 210' are grown beyond the regions 207 and 207' until it reaches the non-nucleation surface 203, and at last the crystal grain 210 grown from the nucleation surface 207 is contacted with the crystal grain 210' grown from the nucleation surface 207' to form a grain boundary 211 (FIG. 2C).

As to the above method for forming crystals in the prior art, an example has been reported that a plurality of Si monocrystals is formed by CVD method using amorphous silicon nitride as the nucleation surfaces 207 and 207' and silicon oxide as the non-nucleation surface 203 (see the above paper); and an example that silicon oxide is used as the non-nucleation surface 203, and Si ions are implanted into the non-nucleation surface 203 by convergent ion beam to form the nucleation surfaces 207 and 207', and a plurality of Si monocrystals is formed by CVD method (35th Meeting of Unions of Applied Physics, 28p-M-9, (1988)).

As the second method, an example has been reported that seed crystals are arranged on a non-nucleation surface instead of nucleation surfaces, and single crystal grains are grown by growing the seed crystals (Meeting of Physical Society, Preliminary Abstracts II, 27a-C-2, (1990)).

Relating to flattening of crystal groups obtained by the above-mentioned methods for forming crystals, for example, Japanese Patent Application Laid-Open No. 2-209730 has proposed a selective polishing. This is a technique which comprises conducting the selective polishing by making use of the difference in mechanical processing speeds to grinding particles. Specifically, the surface of a body to be polished in which the surface of the region having a higher processing speed is higher in level than the surface of the region having a lower processing speed, is mechanically polished with a processing liquid containing the above-mentioned grinding particles, and the region having a higher processing speed is flattened to the region having a lower processing speed, where the latter is used as a stopper.

Flattening treatment of crystals formed by the above first and second methods for forming crystals, for example was carried out as follows by use of the above-mentioned technique.

FIGS. 3A to 3C are cross-sectional views for illustrating flattening processes.

As shown in FIG. 3A, concavities are previously formed on a substrate 301 having a lower processing speed compared with that of crystal, and then nucleation surfaces or seed crystals (in this case, a nucleation surface 307 is used) are formed. Next, as shown in FIG. 3B, a single monocrystal at the center of the nucleation surface 307 is grown on the non-nucleation surface 303, and the concavity is filled with the grown monocrystal 310. Then, as shown in FIG. 3C, the monocrystal 310 is flattened by polishing until all the upper surface 313 of the substrate 301 is exposed.

In the case of forming an integral circuit having a higher integral degree on an amorphous insulating substrate, the insulator region of the device is required to have a smaller area than that of the insulator region of the device ordinarily required. To achieve that, each of the device regions need to be separately formed from the insulator regions. On the other hand, the forms of crystal regions required for individual devices used in integral circuits are not only square, but also are rectangle, a shape of ] and so on, and are not necessary consistent with the forms of monocrystals obtained by the above first and second methods. In order to maintain high quality devices, it is required that a crystal grain boundary not be contained in the device region. However, when such a great monocrystal is grown so as not to contain crystal grain boundary within the region required for a device, parts not capable of being used as the device region are present in one single crystal region, resulting in an increase in the area required for forming a total integral circuit, and also requiring longer wiring between devices.

SUMMARY OF THE INVENTION

An object of the present invention is to provide a method for forming a crystal article by forming a plurality of monocrystals with the desired size on the desired positions of a substrate, which comprises forming flat monocrystals in a concavity having the desired form and size so as to be able to form a device at the desired position required in integral circuits.

The present invention to solve the above problems is a method for forming a crystal article comprising forming a plurality of monocrystals with the desired size at the desired position on a substrate made of an amorphous insulating material by crystal forming treatment and having a non-nucleation surface, wherein prior to the crystal forming treatment forming a plurality of concavities having the desired size and form are respectively formed in the region to be covered with a single monocrystal in the above substrate, and a single crystal is formed to fill the plurality of concavities by crystal forming treatment, and removing and flattening the monocrystal to the same level as the upper surface of the substrate.

When a crystal is grown from the upper part to the lower part beyond the level-difference, there is a case that a void or a defect is formed at the level-difference. In this case, when a device is formed using that part, the characteristics of the device are deteriorated such that low mobility and increasing of leak current occur. The present inventor has considerably examined methods for forming crystal articles. As the result, he has found that when the level-difference is shallow or has a slope with an obtuse angle, a void or a defect is prevented at the level-difference, and a single crystal can be formed beyond the level-difference over a plurality of concavities. In this case, the depth of concavity is 2 μm or less, preferably 1 μm or less. Moreover, when the side wall of the concavity was perpendicular, preferably having a slope which shifts to the upper perifery of the concavity at an obtuse angle, crystallinity of such slope was better at the periphery of the side wall.

Accordingly, a starting point of crystal growth is not limited to the inside of the concavity, and may be the upper surface of a substrate. Using the desired position of the substrate as the starting point, a single monocrystal can be grown so as to fill a plurality of concavities, whereby flat monocrystal regions required for integral circuits can be formed at the concavities having the desired positions, forms and sizes. Further, by arranging devices with a high density on the flat single crystal regions, a circuit having good performances can be formed.

DETAILED DESCRIPTION OF THE PREFERRED EMBODIMENTS

One embodiment of the method for forming a crystal article of the present invention is described with reference to FIGS. 1A to 1C.

Substrate

A substrate 101 to be used in the present invention may be consisted of a material (a stopper material) which acts as a non-nucleation surface in crystal forming treatment, and has a slower mechanical processing speed than that of the deposited crystal to grinding particles in the flattening step, or may consist of such material formed on a subbing substrate. The form of substrate 101 is not limited, so far as it is proper for crystal forming treatment and the flattening step.

Materials to act as a non-nucleation surface and also a stopper material, are different depending on deposited materials. For example, when a material to be deposited is silicon, glass such as quartz, etc. or alumina is used, and the surface is caused to be a non-nucleation surface by treatment such as oxidation, nitriding, etc. Stopper materials include silicon, metals and so on.

Concavity

In the present invention, monocrystals finally remain only at the concavity formed on a substrate. The concavities are formed on a substrate so as to be filled with a monocrystal formed by controlling its position in crystal forming treatment. The concavities are formed with the position, number, form and size required in the following formation of integral circuit, etc. within the region filled with a single monocrystal. The method for forming the concavities is not particularly restricted unless it is responsible for contamination by impurities in the next step. For example, there is a method comprising forming a pattern by lithography used in the ordinary silicon process, followed by wet etching or reactive ion etching. In the case of forming concavities on a substrate, the concavities may be formed on a subbing substrate, followed by forming non-nucleation surfaces or nucleation surfaces thereon, or a material having non-nucleation surfaces or nucleation surfaces deposited on a subbing substrate, followed by forming the concavities on the upper surface of the material.

Crystal Forming Treatment

A method for forming a monocrystal grain on a substrate include, for example, the above-mentioned first and second methods, but are not limited to these methods.

Figure 1A:
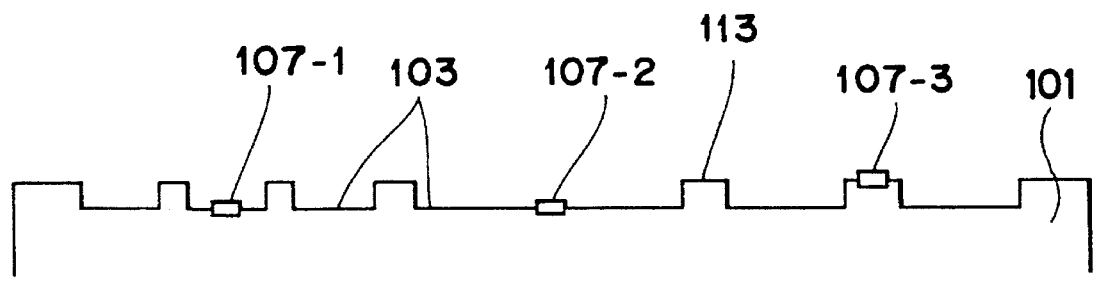
FIGS. 1A to 1C are cross-sectional views for illustrating one embodiment of the present invention and steps of forming a crystal thin film according to an Example.

In the first method, a non-nucleation surface 103 and nucleation surfaces 107-1, 107-2 and 107-3 are formed on a subbing substrate to form a substrate (FIG. 1A). The nucleation surfaces may be present on the upper surface of the subbing substrate or on the surface of a film newly deposited on the subbing substrate. The nucleation surface should have a larger nucleation density for a material constituting a monocrystal than that of the non-nucleation surface, and also have a sufficiently small area so as to form only a single nucleus from which a monocrystal is grown. The nucleation density of the nucleation surface may be $10^2$ times, preferably $10^3$ times more than that of the non-nucleation surface. For example, in the case that the non-nucleation surface comprises silicon oxide film or quartz glass, materials for nucleation surface include silicon nitride film and silicon oxide, silicon nitride, etc. containing excess of Si, but are not limited to them.

Figure 1B:
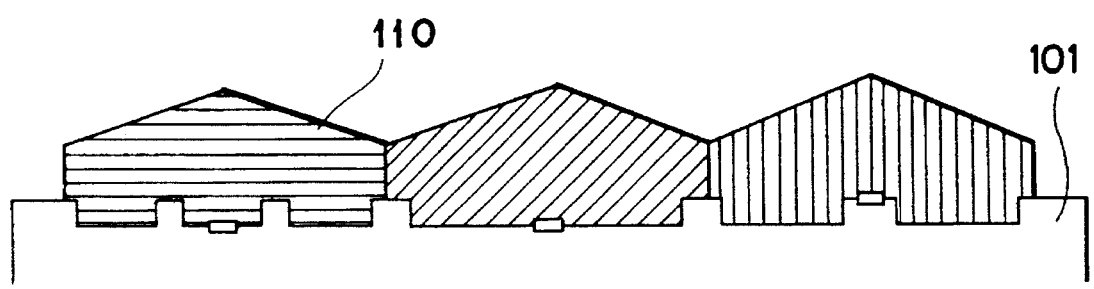
Figure 1C:
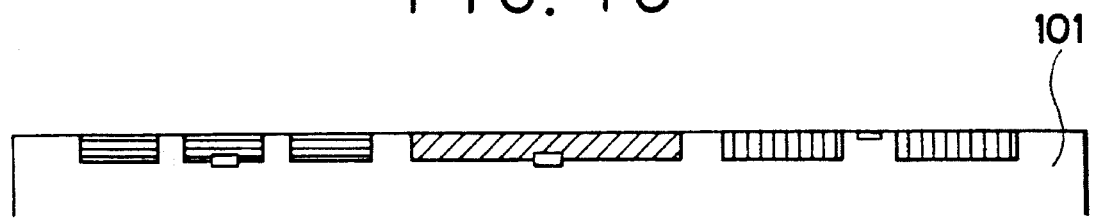
Figure 2A:
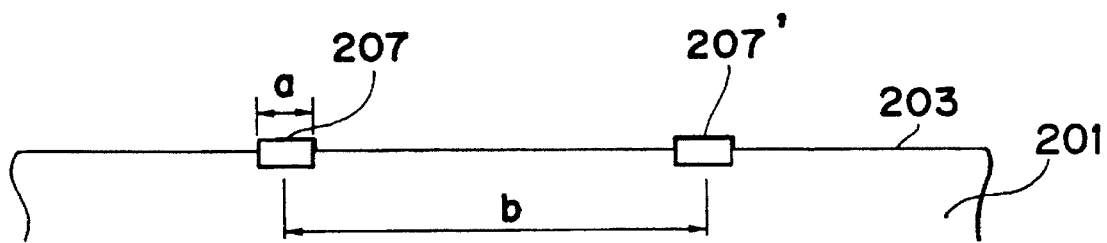
FIGS. 2A to 2C are cross-sectional views for illustrating steps of forming crystals according to the prior art.
Figure 2B:
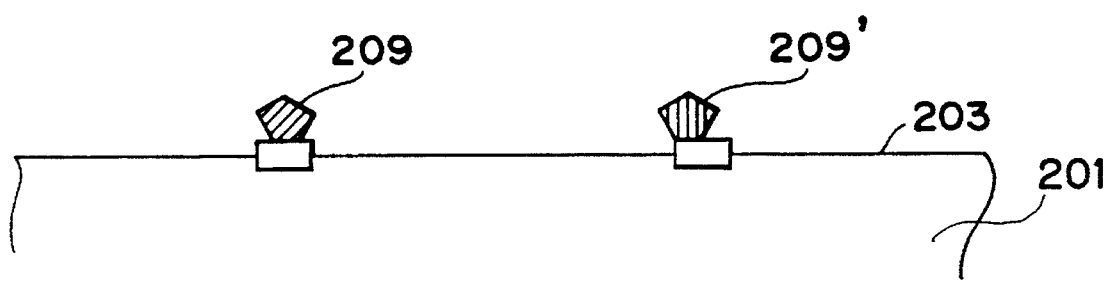
Figure 2C:
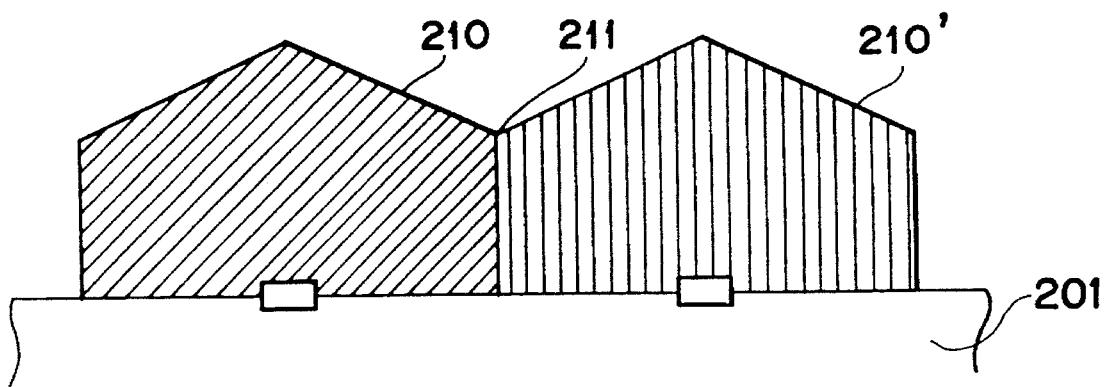
Figure 3A:
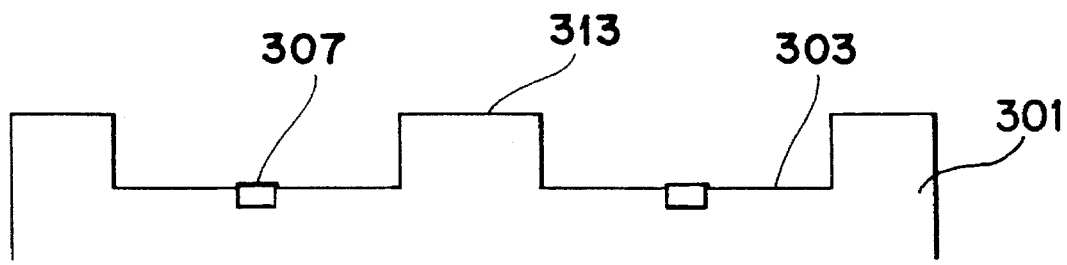
FIGS. 3A to 3C are cross-sectional views for illustrating steps of flattening treatment.
Figure 3B:
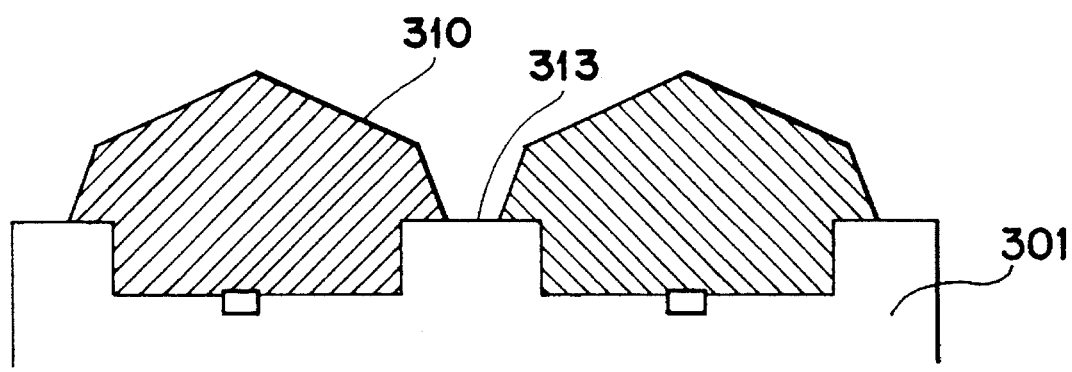
Figure 3C:
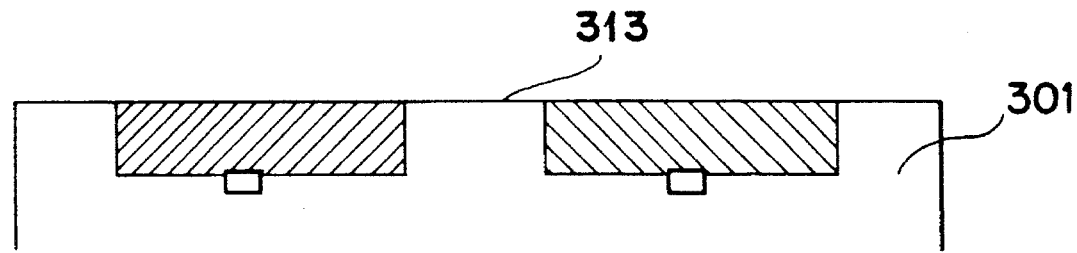

As shown in FIG. 1B, the following step is a crystal forming step. Methods for forming a crystal include chemical vapor deposition (CVD) method, MOCVD method, plasma CVD method, etc.

In the second method a non-nucleation surface is formed on a subbing substrate, followed by arranging seed crystals on the non-nucleation surface instead of nucleation surfaces 107 to form a substrate. The seed crystals are grown in the same manner as in the first method to form monocrystals.

The non-nucleation surface may be the surface of the substrate itself or the surface of a material deposited on the subbing substrate. The material is not restricted so far as it is an amorphous insulating material. It is essential in the present invention that nuclei are not grown on the non-nucleation surface during crystal growth. For example, the material for non-nucleation surface includes a silicon oxide film, quartz glass, a silicon nitride film and so on.

Prior to crystal forming treatment, minute monocrystals which are a material constituting the crystal, are arranged at the desired positions as seed crystals. For example, this method comprises arranging primary seeds having a sufficiently small surface area so as to aggregate a material constituting the crystal by heat treating at the desired positions of the nonnucleation surface on the non-nucleation surface with a minute size, and then heat treating their primary seeds at a lower temperature than the melting temperature under hydrogen atmosphere to cause them to aggregate to monocrystalize the primary seeds. In addition, seed crystals may be formed by heat treating a polycrystalline semiconductor film added with a high concentration of impurity such as phosphorus, boron, arsenic, etc. This method is due to monocrystallization by abnormal grain growth of a grain in the polycrystalline film. The crystal forming treatment is the same as in the first method. As the result of the crystal forming treatment, a monocrystal having the desired size is obtained.

In any crystal forming method, the starting point for crystal growth may be within the concavities or outside the concavities (the upper surface of the substrate).

Flattening Process

After forming crystals on a substrate, flattening treatment is carried out. The flattening is conducted by polishing in this case. For example, using a polishing apparatus used usually in polishing of silicon wafers, polishing is conducted by use of a polishing liquid comprising a suspension of grinding particles such as colloidal silica, etc. Crystal grains formed by crystal forming treatment of the present invention have a peak form. As the polishing progresses, the crystal grains are polished from their tops parallel to the surface of the substrate, and polishing is 10 completed when the upper surfaces of the crystal grains become the same level as the upper surface of the substrate which acts as a stopper (FIG. 1C).

When a field-effect transistor is formed in the crystal layer formed thus having a size of from several μm to several tens μm and containing no crystal grain boundary, for example a single crystal silicon layer, the transistor exhibits performances comparable to that of a transistor formed on a monocrystal silicon wafer.

Constructed complementary field-effect transistors (C-MOS transistors) are not interferred with each other because adjacent monocrystal silicon layers are electrically separated by silicon oxide. Moreover, because the thickness of the active layer of device is thinner than that of Si wafer, erroneous working by charge in the wafer generated by irradiation of radiation does not occur. In addition, speed-up of the device is possible because the parasitic capacity of the device is reduced. Monocrystal layers are economically formed on a substrate having a large area compared with using Si wafers because any substrate can be used. Also, because monocrystals can be formed on other substrates such as semiconductor, piezoelectric element, dielectric, etc., three dimention integral circuits with multi-function can be realized.

Examples of the present invention are described in detail with reference to FIGS. 1A to 1C and FIG. 4A and FIG. 4B.

EXAMPLE 1

An example in which a plurality of Si monocrystal thin films was formed according to the present invention is described below.

Figure 4A:
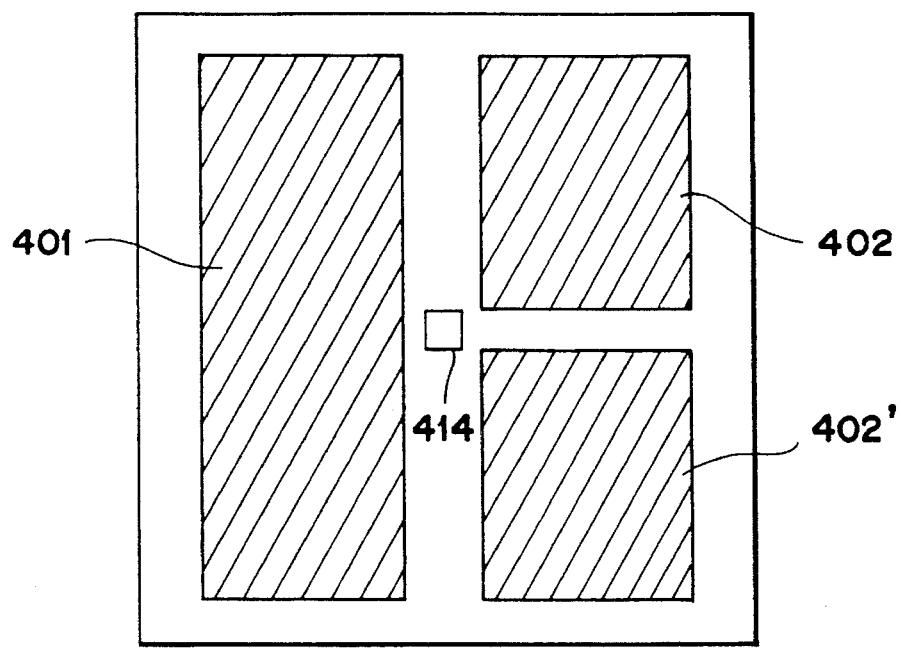
FIGS. 4A and 4B are plane views for illustrating a crystal thin film according to the present invention and a circuit formed on the crystal thin film.

(1) On a fused quartz glass substrate 101 comprising a square having sides of 30 μm, a concavity comprising an area of 10 μm×26 μm and a depth of 10,000 Å and two concavities comprising an area of 10 μm×12 μm and a depth of 10,000 Å were formed by photolithography and etching with a buffered hydrofluoric acid as shown FIG. 4A.

In this case, the side walls of the concavities were sloped by side-etching. The surface thus formed was a non-nucleation surface (FIG. 1A). For comparison, a substrate having a surface comprising concavities with the same size as in the above surface and a depth of 4 μm formed by reactive ion etching, was prepared.

(2) Next, a silicon nitride film was deposited to 1,000 Å thickness as a nucleation surface thin film by reduced CVD method using dichlorosilane and ammonia. By patterning this silicon nitride film, as shown in FIG. 4A, silicon nitride comprising a square having sides of 2 μm was arranged as a nucleation surface 107 at the stopper position between the above three concavities (FIG. 1A).

(3) When these substrates were set on a CVD apparatus, by crystal forming treatment under the conditions of 80 Torr, 1050° C. and $SiH_2Cl_2/HCl/H_2=0.53/1.5/100$ (l/min), Si nucleus was formed only on the silicon nitride area. As continuing crystal growing, the crystal was isotropically grown from the nucleation surface, contacted with the adjacent crystal, and further filled the void of the concavity to form a square having sides of 30 μm of which shape was a peak shape having a height of 20 μm (FIG. 1B).

(4) Then, monocrystals were polished using a processing liquid containing colloidal silica (an average particle size: 0.1 μm) comprising silicon oxide by use of an ordinary silicon wafer surface-polishing apparatus under a pressure of 100 g/cm$^2$ at 30° C. to 40° C. As the result, as shown in FIG. 1C, Si monocrystals were polished, and polishing was completed when Si monocrystals became the same level as the stopper 113 to give a flat Si monocrystal thin film having a thickness of 10,000 Å±400 Å on the 4 inch fused quartz glass substrate.

In the other 9 sheets of substrate simultaneously polished, the obtained Si monocrystal thin films had a thickness of 10,000 Å±500 Å. When the cross-section of the monocrystals were observed by defect actuarizing etching, that is, secco etching, no defect was found particularly near the side walls, a void was not generated, and the crystals had good crystallinity. On the other hand, for comparison, when the cross-section of monocrystals formed on the comparative substrate containing concavities having a depth of 4 μm were observed similarly by secco etching, a void had been formed under the lower part of the side wall of concavity, and a defect had been formed on the upper part of the level-difference, which is assumed to be introduced when the crystal grows over the level-difference.

Figure 4B:
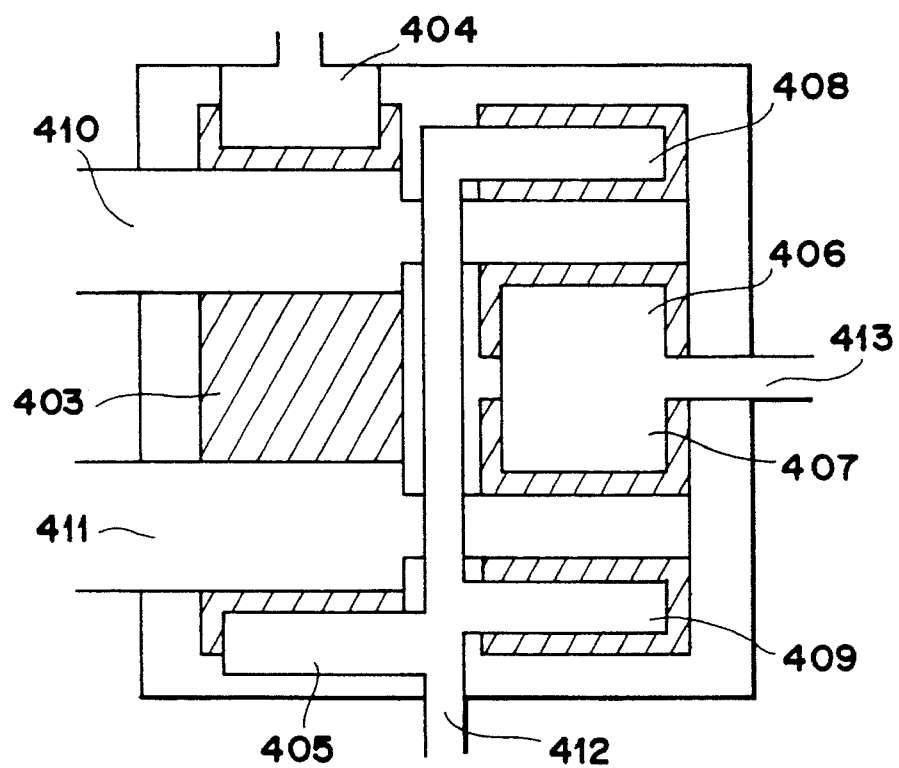

(5) A NAND circuit was formed on these monocrystals using MOS transistors prepared by use of an ordinary semiconductor process as shown in FIG. 4B. In FIG. 4B, two n-MOS transistors were formed on the concavity 401, and p-MOS transistor was formed in the concavities 402 and 402', respectively. 403, 404, and 405 are a p-type semiconductor region comprising source and drain of n-MOS transistor. 406, 407, 408 and 409 are an n-type semiconductor region comprising source and drain of p-MOS transistor. The above regions were formed by ion implanting As and B into monocrystals in the concavities, respectively. 410 and 411 are gate electrodes formed on the gate oxide film. A gate length L and a gate width W were L/W=6 μm/10 μm in n-MOS and L/W=3 μm/10 μm in p-MOS, respectively. Therefore, although the concavities were different in size and form, no crystal grain boundary was present in the concavities because the crystals were grown fully filling all the three concavities, and performances of the transistors were comparable to that of transistors formed using monocrystal silicon wafers.

EXAMPLE 2

Example 2 in which a plurality of Si monocrystal grains were formed according to the present invention is described below.

(1) On an Si wafer substrate, a silicon oxide film was deposited to 13,000 Å thickness by heat oxidation method, and then rectangular concavities having an area of 8 μm×28 μm and a depth of 5,000 Å were formed at 2 μm intervals by photolithography and etching with a buffered hydrofluoric acid. The surface thus formed non-nucleation surface (FIG. 1A).

(2) Next, a silicon nitride film was deposited to 300 Å thickness on the substrate by LPCVD method. Then, by patterning this silicon nitride film by photolithography used in the ordinary semiconductor process and reactive ion etching (RIE), squares of $SiN_4$ having sides of 2 μm were arranged as nucleation surfaces 107 in a lattice pattern at 30 μm intervals, where the nucleation surface was placed at each center of the concavities (FIG. 1A).

(3) On the above substrate, crystal forming treatment was carried out by CVD method using dichlorosilane, hydrogen chloride and hydrogen. The conditions for crystal growth were as follows. $SiH_2Cl_2/HCl/H_2=0.53/1.4/100$ (1/min), 990° C., 80 Torr. As the result, a crystal was isotropically grown from the nucleation surface, contacted with the adjacent crystal, and further fully filled the void of the concavity to form a square having sides of 30 μm, where the crystal shape was a peak form having a height of about 20 μm.

(4) Then, Si monocrystals were polished using a processing liquid containing colloidal silica (an average particle size: 0.1 μm) of $SiO_2$ by an ordinary silicon wafer surface-polishing apparatus under a pressure of 100 g/cm² at 30° C. to 40° C. As the result, as shown in FIG. 1C, Si monocrystals were polished, and polishing was completed when Si monocrystals became the same level as the stopper 113 which was the silicon oxide film region directly formed on the substrate to give a flat Si monocrystal thin film having a thickness of 5,000 Å±200 Å in each concavity on the 4 inch Si wafer substrate. In the other 9 sheets of substrate simultaneously polished, the obtained Si monocrystal thin films had a thickness of 5,000 Å±250 Å.

EXAMPLE 3

(1) On a fused quartz glass substrate 101, rectangular concavities having an area of 5 μm×15 μm and a depth of 5,000 Å were formed at 5 μm intervals by photolithography and reactive ion etching. The surface thus formed was a nonnucleation surface (FIG. 1A).

(2) Next, a polycrystalline silicon film was deposited to 2,000 Å thickness on the surface by LPCVD, and then $^{31}P^+$ (phosphorus) was implanted as an impurity into the silicon film at an acceleration voltage of 30 KeV and $2\times10^{15}cm^{-2}$. Then, by patterning the silicon film by photolithography used in the ordinary semiconductor process and reactive ion etching (RIE), squares of polycrystalline silicon film having sides of 1.2 μm were arranged as primary seeds at 20 μm intervals in lattice pattern, where each primary seed was placed at the stopper region between the adjacent concavities (FIG. 1A).

(3) Next, the substrate was heat treated at 1,100° C. under hydrogen atmosphere for 3 min. As the result, each primary seed was aggregated to form a monocrystal seed.

(4) On the above substrate, crystal forming treatment was carried out by CVD method using dichlorosilane, hydrogen chloride and hydrogen. The conditions for crystal growth were as follows. $SiH_2Cl_2/HCl/H_2=0.53/1.6/100$ (1/min), 1,040° C., 80 Torr. As the result, a monocrystal having a particle size of 28 μm was formed from each nucleation surface as the starting point.

(5) Then, Si monocrystals were polished using a processing liquid containing colloidal silica (an average particle size: 0.1 μpm) of $SiO_2$ by an ordinary silicon wafer surface-polishing apparatus under 100 g/cm² at 30° C. to 40° C. As the result, as shown in FIG. 1C, Si monocrystals were polished, and polishing was completed when Si monocrystals became the same level as the stopper 113 to give a Si monocrystal thin film having a thickness of 5,000 Å±200 Å each on the 4 inch fused quartz glass substrate. In the other 9 sheets of substrate simultaneously polished, the obtained Si monocrystal thin films had a thickness of 5,000 Å±250 Å.

EXAMPLE 4

(1) On a Si wafer substrate, a silicon oxide film was deposited to 10,000 Å thickness by heat oxidation method, and then rectangular concavities having an area of 5 μm×15 μm and a depth of 8,000 Å were formed on the substrate at 5 μm intervals by photolithography and etching with a buffered hydrofluoric acid. Then, a silicon nitride film was formed to 1,000 Å thickness on the concavities by LPCVD method. The surface thus formed was a non-nucleation surface (FIG. 1A).

(2) Next, a polycrystalline silicon film doped with P (phosphorus) of $3\times10^{15}$ cm$^{-2}$ was deposited to 250 Å thickness on the surface by LPCVD method. By patterning this silicon film by EB (electron beam) exposure method, squares of polycrystalline silicon film having sides of 0.3 μm were arranged as primary seeds at 20 μm intervals, where each primary seed was placed at the stopper region between the adjacent concavities (FIG. 1A). Next, the substrate was heat treated at 990° C. under hydrogen atmosphere for 2 min. to convert the primary seeds to monocrystal seeds.

(3) On the above substrate, crystal forming treatment was carried out by CVD method using dichlorosilane, hydrogen chloride and hydrogen. The conditions for crystal growth were as follows. $SiH_2Cl_2/HCl/H_2=0.53/2.0/100$ (1/min.), 990° C., 80 Torr. As the result, a monocrystal having a particle size of 28 μm was formed from each nucleation surface as the starting point.

(4) Then, Si monocrystals were polished using a processing liquid containing colloidal silica (an average particle size: 0.01 μm) of $SiO_2$ by an ordinary silicon wafer surface-polishing apparatus under a pressure of 100 g/cm at 30° C. to 40° C. As the result, as shown in FIG. 1C, Si monocrystals were polished, and polishing was completed when Si monocrystals became the same level as the stopper 113 which was the silicon oxide film region directly formed on the substrate to give a flat Si monocrystal thin film having a thickness of 8,000 Å±400 Å in each concavity on the 4 inch Si wafer substrate. In the other 9 sheets of substrate simultaneously polished, the obtained Si monocrystal thin films had a thickness of 8,000 Å±450 Å.

As described above, according to the method for forming crystal articles of the present invention, monocrystal thin films can be formed on an amorphous substrate in the state that each monocrystal thin film is surrounded by an insulator region and is flat and precisely controlled at the desired positions with the desired form. Accordingly, integral circuits can be formed without lengthening wiring and also with small limitation in device arrangements. Integral circuits utilizing characteristics of monocrystal thin film can be formed without variation of the performances and also with a higher integral degree and yield.

What is claimed is:

1. A method for forming a crystal article comprising the steps of:

(a) providing a substrate having a non-nucleation surface comprising an amorphous insulating material, (b) forming a plurality of concavities, each concavity having a prescribed size and form in a region to be covered with a single monocrystal corresponding in size and form to each of said concavity on the substrate, (c) forming a seed crystal or a nucleation surface for monocrystal formation at any position within the region on the substrate, (d) growing a monocrystal from the seed crystal or the nucleation surface to cover the plurality of concavities with the monocrystal, and (e) flattening the monocrystal by removing it to the same level as the upper surface of the substrate, wherein the plurality of concavities have different sizes and forms.

2. The method according to claim 1, wherein the flattening treatment of the monocrystal is carried out by mechanically polishing the monocrystal to the same level as the upper surface of the substrate by using a processing liquid containing grinding particles, utilizing the upper surface of the substrate comprising a material having a lower mechanical processing speed than that of the monocrystal to the grinding particles as a stopper.

3. The method according to claim 1, wherein the substrate has a free surface on which the non-nucleation surface and a nucleation surface having a larger nucleation density than the nucleation density of the non-nucleation surface for a material constituting the monocrystal and having a sufficiently small area so as to form only a single nucleus from which the monocrystal is grown are arranged adjacent to each other, and wherein the substrate is subjected to crystal forming treatment to form a nucleus on the nucleation surface, and the single monocrystal is grown from the nucleus as the starting point.

4. The method according to claim 1, wherein the non-nucleation surface and only a single monocrystal seed are formed on the substrate and the monocrystal is grown from the seed as the starting point.

5. The method according to claim 4, wherein the monocrystal seed is formed by heat treating a primary seed having a sufficiently small area so as to aggregate by heat treatment at a lower temperature than the melting temperature of the primary seed under hydrogen atmosphere to form the monocrystal.

6. The method according to claim 3 or 5, wherein the monocrystal is silicon.

7. The method according to claim 3, wherein the nucleation surface is made of an amorphous material.

* * * * *

UNITED STATES PATENT AND TRADEMARK OFFICE
CERTIFICATE OF CORRECTION

PATENT NO. : 5,471,944

DATED : December 5, 1995

INVENTOR(S): NOBUHIKO SATO

Page 1 of 3

It is certified that error appears in the above-identified patent and that said Letters Patent is hereby corrected as shown below:

On the title page:
AT [56] REFERENCES CITED

```
    Insert, --FOREIGN PATENT DOCUMENTS
            2-209730  8/1990  Japan
              412755  2/1991  European Pat. Off.
              364139  4/1990  European Pat. Off.
              339793 11/1989  European Pat. Off.
              366276  5/1990  European Pat. Off.--.
              276959  8/1988  European Pat. Off.--.
```

AT [57] ABSTRACT

Line 9, "full" should read --fill--.

COLUMN 1

Line 39, "nonnucleation" should read --non-nucleation--.
   Line 44, "at last" should read --finally--.

COLUMN 2

Line 13, "example" should read --example,--.
   Line 37, "necessary" should read --necessarily--.
   Line 64, "treatment" should read --treatment,--.

UNITED STATES PATENT AND TRADEMARK OFFICE
CERTIFICATE OF CORRECTION

PATENT NO. : 5,471,944

DATED : December 5, 1995

INVENTOR(S): NOBUHIKO SATO

It is certified that error appears in the above-identified patent and that said Letters Patent is hereby corrected as shown below:

COLUMN 3

Line 18, "perifery" should read --periphery--.
    Line 53, "be" (second occurrence) should be deleted.
    Line 54, "consisted" should read --consist--.

COLUMN 4

Line 27, "A method" should read --Methods--.

COLUMN 5

Line 4, "nonnucleation" should read --non-nucleation--.
    Line 8, "monocrystalize" should read --monocrystallize--.
    Line 31, "10" should be deleted.
    Line 38, "example" should read --example,--.
    Line 43, "interferred" should read --interfered--.
    Line 55, "three dimention" should read --three-dimensional--.

UNITED STATES PATENT AND TRADEMARK OFFICE
CERTIFICATE OF CORRECTION

PATENT NO. : 5,471,944

DATED : December 5, 1995

INVENTOR(S) : NOBUHIKO SATO

Page 3 of 3

It is certified that error appears in the above-identified patent and that said Letters Patent is hereby corrected as shown below:

COLUMN 6

Line 6, "(FIG. 1A)." should read --(FIG. 1A) and a nucleation surface 414 as show in FIG. 4A.--.

COLUMN 9

Line 17, "concavity" should read --concavities--.

Signed and Sealed this

Seventh Day of May, 1996

Attest:

BRUCE LEHMAN

*Attesting Officer*    Commissioner of Patents and Trademarks